United States Patent [19]

Sworm

[11] Patent Number: 4,901,007
[45] Date of Patent: Feb. 13, 1990

[54] PORTABLE ELECTRICAL ENERGY MONITOR

[76] Inventor: Timothy D. Sworm, Rte. 9, Box 1, Carbondale, Ill. 62901

[21] Appl. No.: 238,481

[22] Filed: Aug. 31, 1988

[51] Int. Cl.[4] .................... G01R 1/04; H01R 13/52
[52] U.S. Cl. .................................. 324/110; 324/142; 324/156; 439/304
[58] Field of Search .................. 324/142, 110, 156; 439/304; 70/57

[56] References Cited

U.S. PATENT DOCUMENTS

| | | | |
|---|---|---|---|
| 2,010,047 | 8/1935 | Green | 324/156 |
| 2,099,761 | 11/1937 | Sutherlin | 324/110 |
| 4,479,688 | 10/1984 | Jennings | 439/304 |
| 4,593,541 | 6/1986 | Hollis | 70/57 |
| 4,603,931 | 8/1986 | Ruffman | 439/304 |
| 4,674,304 | 6/1987 | Guiler | 324/110 |

FOREIGN PATENT DOCUMENTS 2158662 11/1985 United Kingdom ................ 439/304

Primary Examiner—Ernest F. Karlsen
Attorney, Agent, or Firm—Polster, Polster and Lucchesi

[57] ABSTRACT

A portable electrical energy monitor for measuring the electrical energy usage of an appliance or the like is disclosed. The monitor includes an enclosure having a cover for opening and closing the enclosure. An electrical measurement device or circuit is positioned within the enclosure and includes a receptacle plug for complementary interconnection to a receptacle plug of an appliance, also to be received within the enclosure. The cover of the enclosure is closed when the appliance receptacle plug is operatively interconnected to the receptacle plug of the electrical measuring device or circuit. A visual display device is connected to the electrical measuring device and is mounted to the enclosure for visual display of electrical energy usage of an interconnected appliance. The electrical measuring device or circuit includes a sensing circuit for sensing an electrical condition emanating from an appliance, a switching device energized by the sensing circuit, and an adjustment device which establishes a predetermined electrical condition level from an appliance which is necessary to energize the switching device.

14 Claims, 3 Drawing Sheets

PORTABLE ELECTRICAL ENERGY MONITOR

BACKGROUND OF THE INVENTION

The present invention relates to a portable electrical energy monitor, and more particularly, to a portable electrical energy monitor for measuring the electrical energy usage of an appliance or the like.

In recent times, considerable emphasis has been placed on energy conservation as the result of a rising energy cost and depleting fuel supplies. Most of the energy conservation efforts have been made in industry and government, with very little that the individual consumer could do other than turn off or reduce power use. This is due, in part, to the fact that consumers have had little, if any, guidance in order to determine power consumption, so as to make intelligent decisions.

With respect to electrical energy usage, it is, of course, well known that electrical utilities use externally mounted kilo-watt-hour meters to determine electrical energy usage in individual residences or industrial plants. Such meters must be located in the main supply line to be useful for billing purposes, and they are generally located on the outside of a building so that they can be read without gaining access to the building. Although such meters are conveniently read by utility personnel, they are not easily read, and therefore, not easily used by consumers actually using the electrical energy.

In order to give consumers increased knowledge and information concerning electrical power usage, various monitoring and controlling devices have been proposed to determine consumer power consumption or electrical energy uses. Examples of such devices are shown by U.S. Pat. Nos.: 4,080,568; 4,106,095; 4,120,031; 4,207,557; 4,233,590; 4,253,151; 4,291,375; and 4,630,211. Most of the devices shown in such aforementioned prior art patents are used integrally with or as a part of the basic utility monitoring device, or are generally innerconnected with the overall or complete circuit throughout the house or building. As a result, they are extremely complicated, thus resulting in very expensive units.

Consumers realize that overall power consumption can be monitored by the electrical utility metering devices, if desired; however, a consumer may also desire to monitor a specific appliance, i.e., an air conditioner, refrigerator, television and the like, to determine power consumption or usage. Most of the devices that have been built for consumer monitoring and/or control are so complex and costly that consumers have not been encouraged to employ such devices in order to look for ways to reduce power consumption or determine electrical energy usage.

With respect to property owners, such as owners of multi-family apartment buildings or units, it would be useful to have an electrical energy monitoring device for each multi-family apartment or unit to monitor each tenants usage of power consumption, where the landlord is paying for electric utilities, as part of the tenants rent. Unfortunately, tenants take advantage of this situation, and landlords do not have any practical and economic means of verifying power consumption or electrical energy usage, to determine if it meets acceptable use levels.

SUMMARY OF THE INVENTION

Accordingly, among the several objects and advantages of the present invention include:

the provision of a portable electrical energy monitor which overcomes the aforenoted deficiencies of prior art devices and systems;

the provision of a new and improved portable electrical energy monitor for measuring electric energy usage of an appliance or the like;

the provision of the aforementioned portable electrical energy monitor which can be quickly and easily connected to an appliance, and which provides a continuously monitored and easily visible display unit for use by consumers;

the provision of the aforementioned portable electrical energy monitor in which an appliance receptacle plug can be sealed and/or locked within an enclosure containing the portable electrical energy monitoring system;

the provision of the aforementioned portable electrical energy monitor which employs an electrical measuring means that is operative only after a predetermined electrical condition level from an appliance has been established, to avoid measuring low wattage lights, fans, etc., that may not significantly affect power consumption or usage; and the provision of the aforementioned portable electrical energy monitor which utilizes a minimum number of parts, requires no moving parts, is economical to construct and maintain, is long lasting and durable, facilitates use by the consumer, and is otherwise well adapted for the purposes intended.

Briefly stated, the portable electrical energy monitor of the present invention is capable of measuring electrical energy usage of an appliance or the like and includes an enclosure having a cover for opening and closing the enclosure. Electrical measuring means are provided within the enclosure for determining the electrical energy usage of an appliance, with such electrical measuring means adapted to be coupled to a power source. The receptacle plug connected to the electrical measuring means is provided within the enclosure for complementary interconnection to a receptacle plug of an appliance, also adapted to be received within the enclosure. The cover of the enclosure is adapted to be closed when the appliance receptacle plug is operably innerconnected to the receptacle plug of the electrical measuring means. Connected to the electrical measuring means and mounted on the enclosure are display means for visual display and electrical energy usage of an innerconnected appliance.

The enclosure includes a releasable grommet which is adapted to releasably receive an electrical cord associated with an appliance receptacle plug. The releasable grommet is mounted in a side wall at least partially surrounding and defining the enclosure, with the releasable grommet being secured within the side wall and including flexible finger portions adapted to open and close on the introduction or removal of an electrical cord associated with the appliance plug. The enclosure is configured, arranged and dimensioned relative to the electrical measuring means receptacle plug and the innerconnected appliance receptacle plug so as to prevent unauthorized separation thereof when the cover is closed relative to the enclosure.

The electrical measuring means within the enclosure may be operably innerconnected to an electrical cord extending through another part of the side wall of the enclosure and having a receptacle plug adapted to be plugged into a wall outlet for coupling the electrical measuring means to a power source. A cover of the enclosure, when closed to contain an innerconnected appliance receptacle plug, is also preferably sealed by locking means or the like against unauthorized opening.

In order to measure the electrical energy usage of an appliance electrically connected to an electrical energy usage monitor, there is provided sensing circuit means for sensing an electrical condition emanating from an innerconnected appliance, switching means energized by the sensing circuit means, adjustment means innerconnecting the sensing circuit means and switch means for establishing a predetermined electrical condition level from an appliance necessary to energize the switching means, and visual display means activated by the sensing circuit means when the switching means is energized to visually display the electrical condition from an appliance so as to determine the electrical energy usage thereof.

The sensing circuit means may include current sensing means for sensing the flow of current from an appliance such an iron core with at least one winding. The switching means is preferably a solid state switching device. The adjustment means may include load adjustment means which requires a predetermined level of current flow from an appliance before the switching means is energized. The load adjustment means may include a potentiometer.

Display means may include an elapsed time meter displaying hour meter usage of an appliance or may include a plurality of display meters for determining predetermined conditions of electrical energy usage such as voltage, amperage and/or kilo-watt-hour usage of an appliance.

These and other objects and advantages of the present invention will become more apparent from the ensuing description.

BRIEF DESCRIPTION OF THE DRAWINGS

In the drawings.

Corresponding reference numerals will be used throughout the several figures of the drawings.

DESCRIPTION OF THE PREFERRED EMBODIMENT

Figure 1:
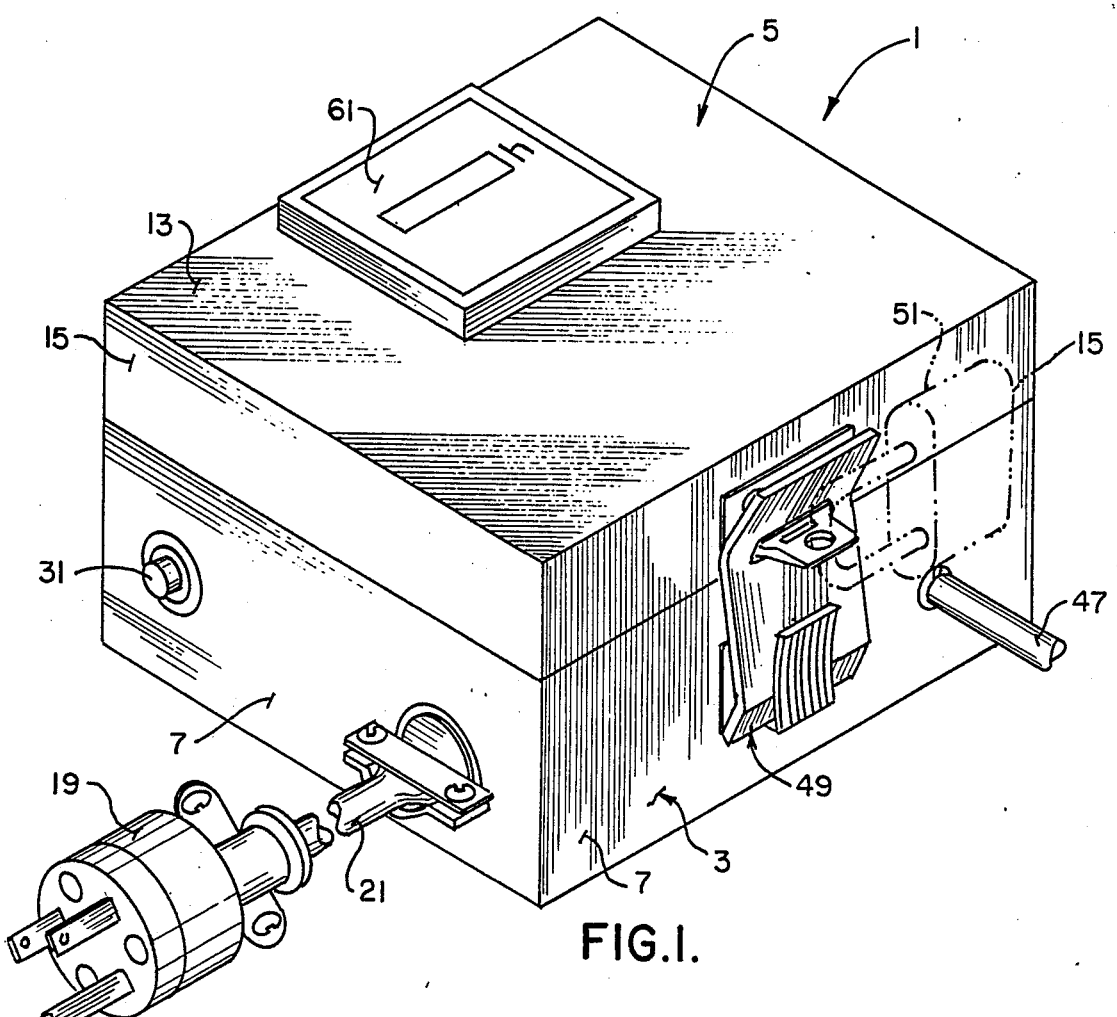
FIG. 1 is an isometric view of a typical enclosure or container which may be used in the portable electrical energy monitor of the present invention.

As shown in FIG. 1 of the drawings, the portable electrical energy monitor 1 is constructed for measuring the power consumption or electrical energy usage of an appliance such as refrigerator, air conditioner, television set or the like. The monitor 1 includes an enclosure or container 3 having a cover 5 for opening and closing the enclosure. As shown in the drawings, the enclosure or container 3 is generally square-shaped with four planar and intersecting side walls 7, each of which extend upwardly from a transversely extending bottom wall 9 to define the enclosure 3. Preferable, the cover is hingingly mounted as at 11 to one of the side walls 7, and further includes a top wall 13 surrounding the depending intersecting planar side walls 15, which are constructed and dimensioned similarly to the enclosure side walls 7, for overlying and enclosing the components of the portable electric energy monitor 1 within the enclosure 3.

Figure 2:
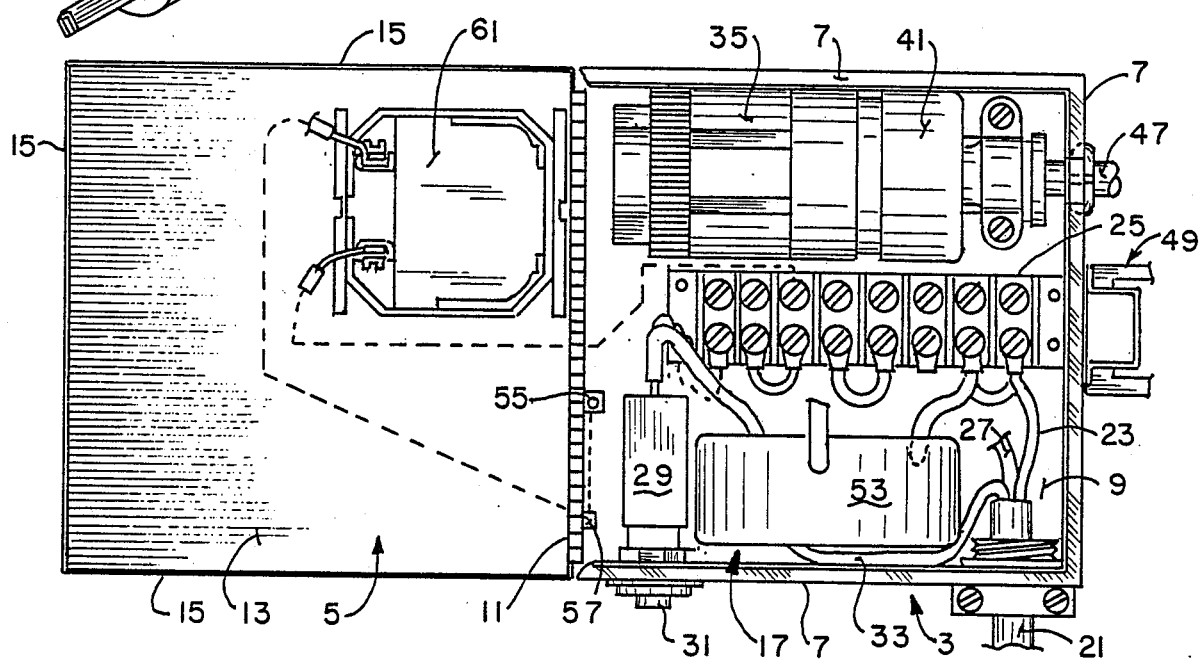
FIG. 2 is a top plan view of the portable electrical energy monitor components contained within the enclosure or container illustrated in FIG. 1 of the drawings.
Figure 5:
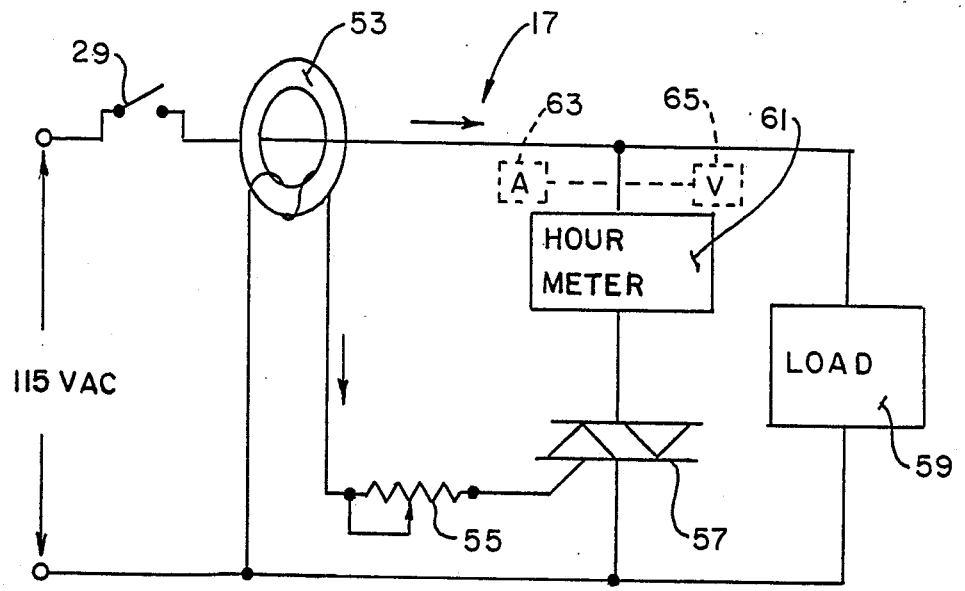
FIG. 5 is a diagrammatic view of the electrical measuring means or circuit employed in the portable electrical energy monitor of the present invention.

The electrical measuring means or device, generally identified at 17 in FIGS. 2 and 5 of the drawings, is contained within the enclosure 3 for determining the electrical energy usage of an appliance. In order to connect the electrical measuring means for circuit 17 to a power source, an externally extending receptacle plug 19 is connected via associated electrical cord 21 which extends through one of the side walls 7 and is coupled to the electrical measuring means or circuit 17 so as to provide a power source therefor. Specifically, as shown in FIG. 2, the associated electrical cord 21 of the externally mounted receptacle plug 19 extends through one of the side walls 17 for innerconnection to the electrical measuring means or circuit 17 within the enclosure 3. One of the lead wire 23 is connected to one of the terminal sections of the terminal block 25 and serves as a ground. A second lead wire 27 of the electrical cord 21 is connected to a circuit breaker switch 29. The circuit breaker switch 29 has a depressible plunger 31 which can be depressed to open to or interrupt the power to the electrical measuring means or circuit 17, or closed to complete a circuit therethrough, coupling the outside power source to the electrical measuring means or circuit 17. A third lead wire 33 of the electrical cord 21 is connected to an internally mounted receptacle plug 35 contained within the enclosure 3 and forming part of the electrical measuring means or circuit 17.

Figure 3:
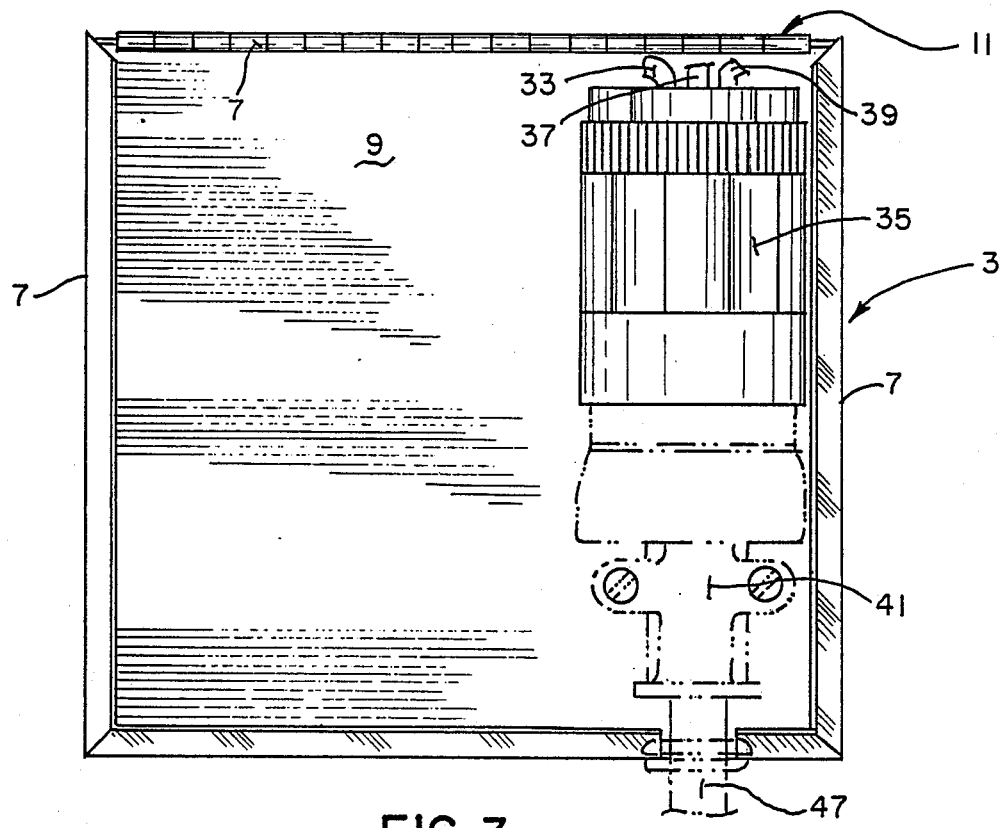
FIG. 3 is a top plan view of a portable electrical energy monitor enclosure or container which incorporates a receptacle plug shown in full lines, for receiving a complementary appliance receptacle plug, shown in dotted lines.
Figure 4:
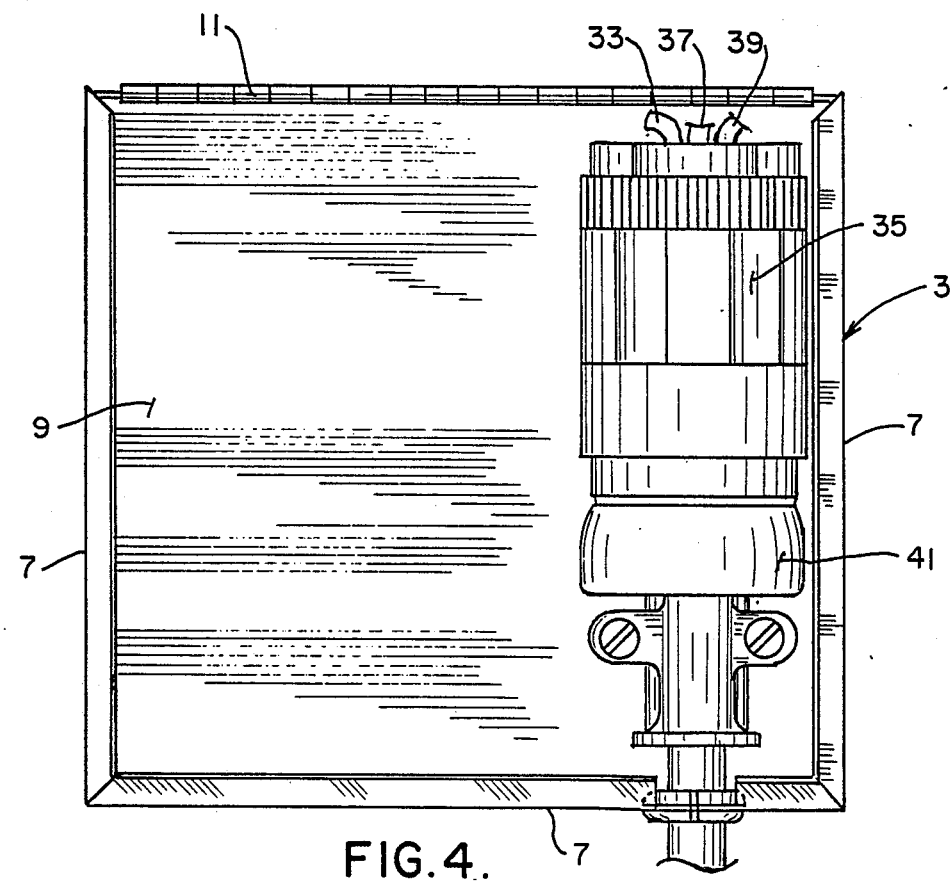
FIG. 4 is a top plan view similar to FIG. 3 and illustrating, in full lines, the complementary innerconnection of the receptacle plug associated with the portable electrical energy monitor of the present invention and an operably innerconnected appliance receptacle plug.

As best seen in FIGS. 3-4 of the drawings, the internally mounted receptacle plug 35 has one of its lead wires connected to the lead wire 33 of the electrical cord 21 so as to complete the electrical circuit of the electrical measuring means or circuit 17 from the outside power source therethrough. A second lead wire 37 is connected to the same terminal section of the terminal block 25 as the lead wire 23 of the electrical cord 21, to also serve as a ground. The third lead wire 39 is connected to another terminal section of the terminal block 25 which, as will be described hereafter, is the terminal section to which a unit or meter is connected. In order to measure power consumption or electrical energy usage of an appliance, an appliance receptacle plug 41 is also adapted to be received within the enclosure 3 for complementary interconnection to the receptacle plug 35 of the electrical measuring means or circuit 17. The appliance receptacle plug 41 is shown in dotted and full lines in FIGS. 3-4 of the drawings to clearly indicate that the appliance receptacle plug 41 is capable of being inserted into and removed from the enclosure 3, as may be desired.

Figure 6:
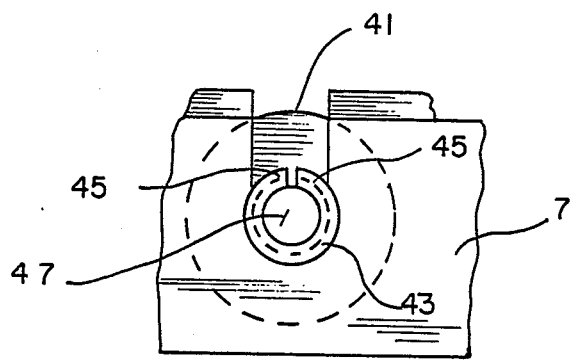
FIG. 6 is a fragmentary isometric view illustrating the manner in which an associated cord of an appliance receptacle plug is releasably introduced and withdrawn from the enclosure or container of the portable electrical energy monitor.

In order to facilitate insertion and removal of the appliance receptacle plug 41 relative to the enclosure 3, one of the side walls 7, as best shown in FIG. 6 of the drawings, incorporates a releasable grommet 43 within a complementary opening in the side wall 7. The releasable grommet 43 includes flexible finger portions 45, 45 adapted to open and close on the introduction or removal of an electrical cord 47 associated with the receptacle appliance plug 41. Thus, when it is desired to insert the appliance receptacle plug 41 into the enclosure 3 for complementary innerconnection with the receptacle plug 35 of the electrical measuring means or circuit 17, the receptacle appliance plug 41 is positioned within the enclosure 3 and plugged into the receptacle plug 35 while the associated electrical cord 47 thereof is pushed downwardly into engagement with the flexible finger portions 45, 45 of the releasable grommet 43, causing the flexible finger portions 45, 45 to deflect and enable the associated electrical cord 47 to be received within the hollow releasable grommet 43. When the receptacle appliance plug 41 and associated electrical cord 47 are mounted relative to the enclosure 3 as set forth above, the cover 5 may then be closed to totally enclose the electrical measuring means or circuit 17, including its associated receptacle plug 35 and innerconnected appliance receptacle plug 41 within the enclosure 3. Corresponding side walls 7 of the enclosure 3 and depending side walls 15 of the cover 5 may be provided with complementary finger interfitting locks or latches 49, as best seen in FIG. 1 of the drawings, thereby enabling a lock 51, shown in dotted lines, to lock the enclosure 3 and associated cover 5 against unauthorized opening. Other sealing or locking mechanisms may be employed as desired.

It will be noted that the enclosure 3 is configured, arranged and dimensioned relative to the receptacle plug 35 of the electrical measuring means or circuit 17 of the innerconnected appliance receptacle plug 41, when complementary innerconnected together, so as to prevent unauthorized separation thereof when the cover 5 is closed relative to the enclosure 3. This enables a landlord, for example, to verify the power consumption or electrical energy usage of an appliance used by a tenant, for example, as may be desired.

Reference is now made to FIGS. 2 and 5 for a specific description of the electrical measuring means or circuit 17 of the present invention. The electrical measuring means or circuit 17 includes a sensing circuit or current sensing means 53, which is shown in the drawings as comprising an iron core with at least one winding wrapped therearound. As is well known, an iron core with a winding will sense and/or monitor the amount of current flowing or amperage within the electrical measuring means or circuit 17. As shown in FIG. 2 of the drawings, one of the leads 33 of the electrical cord 21 extends through the opening of the iron core 53, such that current passing through the electrical measuring means or circuit 17 will be sensed or monitored thereby.

It is preferable that the sensing circuit or current sensing means, illustrated in the form of the iron core 53, sense only a predetermined electrical condition or level of current flow in the electrical measurement means or circuit 17. For this purpose, a load adjustment means, in the form of a potentiometer 55 is provided in the electrical measuring means or circuit 17. Thus, the potentiometer 55 may vary the amount of resistance imparted to the electrical measuring means or circuit 17, such that a predetermined electrical condition or current flow from an appliance must be established over the electrical resistance offered by the potentiometer 55, before the electrical condition or current overcomes the impedance offered of the potentiometer 55. The potentiometer 55 is shown in the electrical measurement means or circuit 17 in FIG. 5 of the drawings as being interconnected between the sensing circuit or current sensing means (iron core 53) and a solid state switching device 55, such as a triac or other solid states switching device. The current flowing in the electrical measuring means or circuit 17 is measured by the iron core 53, to exceed the impedance offered by the potentiometer 55, so as to energizes the solid state switching means 57, enabling the visual display means or hour meter 61 to be activated for measuring the current flow or predetermined electrical condition within the electrical measuring means or circuit 17. Another way to avoid recording small current draw, from a refrigerator light when the door is opened or from an air conditioner fan motor when the fan is running and the compressor is off, is to use a rotary selector switch (not shown) which can be connected to one of a series of windings around the iron core, such that current below a certain level will not be recorded.

It should be borne in mind that the portable electrical energy monitor of the present invention is designed to monitor only a constant current draw and it does not have the ability to distinguish small current variations, as would some complex and sophisticated units. On the other hand, it is extremely reliable, affordable and practical. As a result, the portable electrical energy monitor of the present invention can be made available to a broad range of consumers for their practical use.

As shown in FIGS. 2-5 of the drawings, the visual display means is in the form of an elapsed time meter 61 which measures hour meter usage of an appliance or load 59. The elapsed time meter is shown in FIG. 1 of the drawings as being mounted to an exposed face of the top wall 13, enabling easy reading thereof. In addition or in lieu of the elapsed time or hour meter 61, other display meters may be utilized for predetermined conditions of electrical energy including voltage and amperage. Thus, as shown in dotted lines and FIG. 5 of the drawings, a meter 63 or volt meter 65 may be incorporated in electrical measuring means or circuit 17. The display means may also include kilo-watt-hour usage of an appliance for load 59. The electrical measuring means or circuit 17 may also incorporate a light or other visual indication means to indicate that the appliance is operating, as will be appreciated.

As shown in FIG. 2 of the drawings, the elapsed time or hour meter 61 is connected to the terminal block 25 on one side, and to a solid state switching device 57 on the other. As discussed above, the terminal section, to which the display or elapse time meter 61 is connected, is the same terminal section to which lead 39 of the internally mounted receptacle plug 35 is mounted, to incorporate the same within the electrical measuring means or circuit 17.

In operation of the portable electrical energy monitor 1, a receptacle appliance plug 41 is complementary interconnected relative to the receptacle plug 35 of the electrical measuring means or circuit 17, as discussed above, and the cover 5 of the enclosure 3 is closed, and locked and sealed, as may be desired. When the appliance represented by the load 59 in FIG. 5 of the drawings, exceeds the impedance offered by the potentiometer 55, current flowing in the iron core 53, serving as the sensing circuit or current sensor, energizes the solid state switching device 57 to allow the elapsed time or hour meter 61 to display the amount of hours the appliance or load 59 is operated.

To enable a consumer to readily convert the amount of hours used to dollars and cents, either labels or charts may be provided on the exposed faces of the cover 5, for example, which will allow the user or consumer to readily determine kilo-watt-hours and/or dollars and cents charges for power consumption or electrical energy usage. For calculating purposes a calculator, paper and pen may be also mounted on the enclosure 3. As explained above, additional meters and/or visual indication means may also be employed in the electrical measuring means or circuit 17, if desired, although the addition of such other components will substantially increase the cost of the portable electrical energy monitor 1. Therefore, for practical and low cost operation, a time or hour elapsed meter 61, together with suitable conversion tables or information applied to the exposed faces of the cover 5, will be sufficient to inform the typical consumer of the power consumption and electrical energy usage of a particular appliance. Other features which may be included are: a power light on the enclosure 3 to show that the display meter(s) is operating; a safety ground to the enclosure; built-in mounting holes or a bracket to mount the enclosure 3 on a wall next to a wall outlet; a safety device for current reduction protecting the solid state switch in the circuit; a 220 voltage kit or adapter for conversion of the unit using a 220/110 step down transformer; a power plug on the outside of the enclosure which would be sealed or locked to the enclosure; and multiple windings and multiple clocks to read all the current including the small current generally operating a refrigerator light or the like that would not normally be measured and mounted.

From the foregoing, it will now be appreciated that the portable electrical energy monitor of the present invention readily offers a convenient and economical approach to measuring power consumption or electrical energy usage of a particular appliance.

In view of the above, it will be seen that the several objects and features of this invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

I claim:

1. A portable electrical energy monitor for measuring the electrical energy usage of an appliance including:
   a portable enclosure having a cover for opening and closing said enclosure;
   electrical measuring means within said enclosure for determining the electrical energy usage of an appliance, said electrical measuring means adapted to be coupled intermediate a power source and the appliance;
   an interior receptacle socket connected to said electrical measuring means mounted within said enclosure for complementary interconnection to a receptacle plug extending from an appliance, said appliance receptacle plug being received within said enclosure;
   the cover of said enclosure being closed and locked relative to said enclosure when the appliance receptacle plug is operably interconnected to the receptacle socket of said electrical measuring means; and
   display means connected to said electrical measuring means and mounted on the cover of said enclosure for visual displaying electrical energy usage of an interconnected appliance.

2. The portable electrical energy monitor as defined in claim 1 wherein said enclosure includes a releasable grommet for releasably receiving an electrical cord associated with an appliance receptacle plug.

3. The portable electrical energy monitor as defined in claim 2 wherein said releasable grommet is mounted in a sidewall at least partially surrounding and defining said enclosure, said releasable grommet being secured within a part of said sidewall and including flexible finger portions adapted to open and close on the introduction or removal of an electrical cord associated with the appliance receptacle plug.

4. The portable electrical energy monitor as defined in claim 3 wherein said enclosure is configured, arranged and dimensioned relative to said electric measuring means receptacle socket and interconnected appliance receptacle plug so as to prevent unauthorized separation thereof when said cover is closed relative to said enclosure.

5. The portable electrical energy monitor as defined in claim 4 wherein said electrical measuring means is operably interconnected to an electrical cord extending through another part of the sidewall of said enclosure and having a receptacle plug adapted to be plugged into a wall outlet for coupling said electrical measuring means to a power source.

6. The portable electrical energy monitor as defined in claim 5 wherein said cover and said enclosure include interfitting latch means which are also locked to prevent access to said enclosure.

7. The portable electrical energy monitor as defined in claim 1 wherein said electrical measuring means includes:
   sensing circuit means for sensing an electrical condition emanating from an appliance;
   switching means energized by said sensing circuit means which activates said display means; and
   adjusting means interconnecting said sensing circuit means and said switching means for establishing a predetermined electrical condition level form an appliance necessary to energize said switching means.

8. The portable electrical energy monitor as defined in claim 7 wherein said sensing circuit means includes current sensing means for sensing the flow of current from an appliance, and said adjustment means includes load adjustment means which requires a predetermined level of current flow form an appliance before the switching means is energized.

9. The portable electrical energy monitor as defined in claim 8 wherein said current sensing means includes an iron core having at least one winding.

10. The portable electrical monitor as defined in claim 9 wherein said load adjustment means is a potentiometer.

11. The portable electrical energy monitor as defined in claim 9 wherein said load adjustment means is a rotary selector switch for connecting a selected winding wrapped about the iron core.

12. The portable electrical energy monitor as defined in claim 7 wherein said switching means is a solid state switching device.

13. The portable electrical energy monitor as defined in claim 1 wherein said display means includes an elapsed time meter displaying hour meter usage of an appliance.

14. The portable electrical energy monitor as defined in claim 1 wherein said display means includes a plurality of display meters for determining predetermined conditions of electrical energy usage including voltage and amperage.

* * * * *

UNITED STATES PATENT AND TRADEMARK OFFICE
CERTIFICATE OF CORRECTION

PATENT NO. : 4,901,007
DATED : February 13, 1990
INVENTOR(S) : Timothy D. Sworm

It is certified that error appears in the above-identified patent and that said Letters Patent is hereby corrected as shown below:

Claim 10 - Column 8, line 66 is "electrical monitor";
should be -- electrical energy monitor --.

Signed and Sealed this

Twenty-fourth Day of September, 1991

Attest:

HARRY F. MANBECK, JR.

*Attesting Officer*  *Commissioner of Patents and Trademarks*